United States Patent
Twelves et al.

(10) Patent No.: US 10,227,704 B2
(45) Date of Patent: Mar. 12, 2019

(54) HIGH-MODULUS COATING FOR LOCAL STIFFENING OF AIRFOIL TRAILING EDGES

(71) Applicant: UNITED TECHNOLOGIES CORPORATION, Hartford, CT (US)

(72) Inventors: Wendell V. Twelves, Glastonbury, CT (US); Grant O. Cook, III, Spring, TX (US)

(73) Assignee: UNITED TECHNOLOGIES CORPORATION, Farmington, CT (US)

(*) Notice: Subject to any disclaimer, the term of this patent is extended or adjusted under 35 U.S.C. 154(b) by 281 days.

(21) Appl. No.: 14/903,856

(22) PCT Filed: Jul. 9, 2014

(86) PCT No.: PCT/US2014/045929
§ 371 (c)(1),
(2) Date: Jan. 8, 2016

(87) PCT Pub. No.: WO2015/053832
PCT Pub. Date: Apr. 16, 2015

(65) Prior Publication Data
US 2016/0146022 A1 May 26, 2016

Related U.S. Application Data

(60) Provisional application No. 61/844,108, filed on Jul. 9, 2013.

(51) Int. Cl.
*B64C 1/00* (2006.01)
*C25D 5/56* (2006.01)
(Continued)

(52) U.S. Cl.
CPC ............ *C25D 5/56* (2013.01); *B05D 5/00* (2013.01); *B05D 7/02* (2013.01); *B22C 7/023* (2013.01);
(Continued)

(58) Field of Classification Search
None
See application file for complete search history.

(56) References Cited

U.S. PATENT DOCUMENTS 2,959,229 A * 11/1960 Meier .................. B64C 11/205
416/229 R
4,315,970 A 2/1982 McGee
(Continued)

FOREIGN PATENT DOCUMENTS

CN 103061827 A 4/2013
EP 043174 A2 11/1996
(Continued)

OTHER PUBLICATIONS

English Abstract for Japanese application No. JP06170514A; Filing date: Jun. 21, 1994.
(Continued)

*Primary Examiner* — Richard G Davis
(74) *Attorney, Agent, or Firm* — Cantor Colburn LLP

(57) ABSTRACT

An airfoil is disclosed. The airfoil may comprise a leading edge, a body portion and a trailing edge formed from a high-modulus plating. The body portion of the airfoil may be formed from a material having a lower elastic modulus than the high-modulus plating. The high-modulus plating may improve the stiffness of the trailing edge, allowing for thinner trailing edges with improved fatigue life to be formed.

16 Claims, 4 Drawing Sheets

(51) Int. Cl.

| | |
|---|---|
| *B33Y 80/00* | (2015.01) |
| *B05D 5/00* | (2006.01) |
| *B05D 7/02* | (2006.01) |
| *B22C 7/02* | (2006.01) |
| *B22C 9/04* | (2006.01) |
| *B22C 9/10* | (2006.01) |
| *B22F 3/22* | (2006.01) |
| *B22F 5/04* | (2006.01) |
| *B28B 1/24* | (2006.01) |
| *B28B 7/34* | (2006.01) |
| *B28B 11/04* | (2006.01) |
| *B28B 11/24* | (2006.01) |
| *B32B 3/26* | (2006.01) |
| *B32B 7/12* | (2006.01) |
| *B32B 15/04* | (2006.01) |
| *B32B 15/08* | (2006.01) |
| *B32B 15/20* | (2006.01) |
| *B32B 37/12* | (2006.01) |
| *B32B 37/14* | (2006.01) |
| *B62D 35/00* | (2006.01) |
| *B64C 39/02* | (2006.01) |
| *C04B 35/76* | (2006.01) |
| *C04B 35/80* | (2006.01) |
| *C09D 5/26* | (2006.01) |
| *C23C 14/20* | (2006.01) |
| *C23C 16/06* | (2006.01) |
| *C23C 18/16* | (2006.01) |
| *C23C 18/20* | (2006.01) |
| *C23C 18/22* | (2006.01) |
| *C23C 18/31* | (2006.01) |
| *C23C 26/00* | (2006.01) |
| *C23C 28/02* | (2006.01) |
| *C25D 3/02* | (2006.01) |
| *C25D 3/38* | (2006.01) |
| *C25D 3/46* | (2006.01) |
| *C25D 5/48* | (2006.01) |
| *C25D 9/04* | (2006.01) |
| *C25D 11/20* | (2006.01) |
| *F01D 5/00* | (2006.01) |
| *F01D 5/14* | (2006.01) |
| *F01D 5/18* | (2006.01) |
| *F01D 5/28* | (2006.01) |
| *F01D 9/02* | (2006.01) |
| *F01D 9/04* | (2006.01) |
| *F01D 11/08* | (2006.01) |
| *F01D 25/00* | (2006.01) |
| *F04D 29/02* | (2006.01) |
| *F04D 29/32* | (2006.01) |
| *F04D 29/54* | (2006.01) |
| *F42B 10/02* | (2006.01) |
| *B33Y 10/00* | (2015.01) |

(52) U.S. Cl.
CPC ............... *B22C 9/043* (2013.01); *B22C 9/10* (2013.01); *B22F 3/225* (2013.01); *B22F 5/04* (2013.01); *B28B 1/24* (2013.01); *B28B 7/342* (2013.01); *B28B 11/04* (2013.01); *B28B 11/243* (2013.01); *B32B 3/263* (2013.01); *B32B 7/12* (2013.01); *B32B 15/04* (2013.01); *B32B 15/08* (2013.01); *B32B 15/20* (2013.01); *B32B 37/12* (2013.01); *B32B 37/1284* (2013.01); *B32B 37/14* (2013.01); *B33Y 80/00* (2014.12); *B62D 35/00* (2013.01); *B64C 39/024* (2013.01); *B64C 39/028* (2013.01); *C04B 35/76* (2013.01); *C04B 35/806* (2013.01); *C09D 5/26* (2013.01); *C23C 14/20* (2013.01); *C23C 16/06* (2013.01); *C23C 18/165* (2013.01); *C23C 18/1633* (2013.01); *C23C 18/2013* (2013.01); *C23C 18/22* (2013.01); *C23C 18/31* (2013.01); *C23C 26/00* (2013.01); *C23C 28/02* (2013.01); *C25D 3/02* (2013.01); *C25D 3/38* (2013.01); *C25D 3/46* (2013.01); *C25D 5/48* (2013.01); *C25D 9/04* (2013.01); *C25D 11/20* (2013.01); *F01D 5/00* (2013.01); *F01D 5/147* (2013.01); *F01D 5/187* (2013.01); *F01D 5/284* (2013.01); *F01D 5/288* (2013.01); *F01D 9/02* (2013.01); *F01D 9/041* (2013.01); *F01D 11/08* (2013.01); *F01D 25/005* (2013.01); *F04D 29/023* (2013.01); *F04D 29/324* (2013.01); *F04D 29/542* (2013.01); *F42B 10/02* (2013.01); *B32B 2255/10* (2013.01); *B32B 2307/202* (2013.01); *B32B 2307/554* (2013.01); *B32B 2603/00* (2013.01); *B33Y 10/00* (2014.12); *B64C 2201/10* (2013.01); *F05D 2220/32* (2013.01); *F05D 2230/10* (2013.01); *F05D 2230/22* (2013.01); *F05D 2230/30* (2013.01); *F05D 2230/312* (2013.01); *F05D 2230/314* (2013.01); *F05D 2240/122* (2013.01); *F05D 2240/304* (2013.01); *F05D 2300/10* (2013.01); *F05D 2300/11* (2013.01); *F05D 2300/121* (2013.01); *F05D 2300/132* (2013.01); *F05D 2300/133* (2013.01); *F05D 2300/1616* (2013.01); *F05D 2300/171* (2013.01); *F05D 2300/177* (2013.01); *F05D 2300/20* (2013.01); *F05D 2300/30* (2013.01); *F05D 2300/44* (2013.01); *F05D 2300/501* (2013.01); *F05D 2300/603* (2013.01); *F05D 2300/611* (2013.01); *F05D 2300/614* (2013.01)

(56) References Cited

U.S. PATENT DOCUMENTS

| | | | |
|---|---|---|---|
| 4,888,247 | A | 12/1989 | Zweben et al. |
| 5,348,446 | A | 9/1994 | Lee et al. |
| 5,658,506 | A | 8/1997 | White et al. |
| 5,839,882 | A | 11/1998 | Finn et al. |
| 5,854,142 | A | 12/1998 | Inoguchi et al. |
| 5,931,641 | A | 8/1999 | Finn et al. |
| 6,059,533 | A | 5/2000 | Stoker et al. |
| 6,159,589 | A | 12/2000 | Isenberg et al. |
| 6,426,143 | B1 | 7/2002 | Voss et al. |
| 6,551,063 | B1 * | 4/2003 | Lee ............... F01D 5/18 416/224 |
| 6,626,230 | B1 | 9/2003 | Woodrum et al. |
| 6,982,116 | B1 | 1/2006 | Passman et al. |
| 7,452,454 | B2 | 11/2008 | Dolan |
| 7,553,514 | B2 | 6/2009 | Fan et al. |
| 7,645,519 | B2 | 1/2010 | Garamszegi et al. |
| 7,678,852 | B2 | 3/2010 | Kaprinidis |
| 7,776,447 | B2 | 8/2010 | Krawczyk |
| 7,804,228 | B2 | 9/2010 | Sadaka et al. |
| 7,837,439 | B2 | 11/2010 | Bech |
| 7,887,921 | B2 | 2/2011 | Varanasi et al. |
| 8,069,680 | B2 | 12/2011 | Hyde et al. |
| 8,088,498 | B2 | 1/2012 | Smith et al. |
| 8,211,516 | B2 | 7/2012 | Bowers et al. |
| 8,215,518 | B2 | 7/2012 | Hyde et al. |
| 8,215,835 | B2 | 7/2012 | Hyde et al. |
| 8,231,958 | B2 | 7/2012 | Hoover et al. |
| 8,247,050 | B2 | 8/2012 | McCrea et al. |
| 8,303,247 | B2 | 11/2012 | Schlichting et al. |
| 8,313,288 | B2 | 11/2012 | Schlichting et al. |
| 8,322,147 | B2 | 12/2012 | Hyde et al. |
| 8,366,391 | B2 | 2/2013 | Tsukagoshi et al. |
| 8,377,030 | B2 | 2/2013 | Hyde et al. |

(56) References Cited

U.S. PATENT DOCUMENTS

| | | |
|---|---|---|
| 8,394,473 B2 | 3/2013 | McCrea et al. |
| 8,394,507 B2 | 3/2013 | Tomantschger et al. |
| 8,431,222 B2 | 4/2013 | Paul |
| 8,485,387 B2 | 7/2013 | Bowers et al. |
| 8,500,410 B2 | 8/2013 | De Moura et al. |
| 8,603,598 B2 | 12/2013 | Hyde et al. |
| 8,715,439 B2 | 5/2014 | Chakrabarti et al. |
| 8,764,959 B2 | 7/2014 | Smith et al. |
| 8,814,527 B2 | 8/2014 | Huth et al. |
| 2001/0054379 A1 | 12/2001 | Choy et al. |
| 2003/0070387 A1 | 4/2003 | Klocke et al. |
| 2003/0183416 A1 | 10/2003 | White et al. |
| 2004/0222103 A1 | 11/2004 | Marsales et al. |
| 2005/0115839 A1 | 6/2005 | Dolan |
| 2005/0175813 A1 | 8/2005 | Wingert et al. |
| 2005/0271859 A1 | 12/2005 | Tuss et al. |
| 2006/0188730 A1 | 8/2006 | Varanasi et al. |
| 2006/0222846 A1 | 10/2006 | Ackerman et al. |
| 2007/0044765 A1 | 3/2007 | Lincourt |
| 2007/0172643 A1 | 7/2007 | Krawczyk |
| 2007/0184288 A1 | 8/2007 | Garamszegi et al. |
| 2007/0190352 A1* | 8/2007 | Bayer ............... C23C 8/02 428/627 |
| 2007/0251389 A1 | 11/2007 | Katsir et al. |
| 2008/0050600 A1 | 2/2008 | Fan et al. |
| 2009/0082494 A1 | 3/2009 | Kaprinidis |
| 2009/0092842 A1 | 4/2009 | Hoover et al. |
| 2009/0098373 A1 | 4/2009 | Dolan |
| 2009/0142193 A1 | 6/2009 | Bech |
| 2009/0145163 A1 | 6/2009 | Hyde et al. |
| 2009/0145164 A1 | 6/2009 | Hyde et al. |
| 2009/0145793 A1 | 6/2009 | Hyde et al. |
| 2009/0145910 A1 | 6/2009 | Hyde et al. |
| 2009/0145911 A1 | 6/2009 | Hyde et al. |
| 2009/0145912 A1 | 6/2009 | Hyde et al. |
| 2009/0151852 A1 | 6/2009 | Roebroeks |
| 2009/0156939 A1 | 6/2009 | Sadaka et al. |
| 2009/0169368 A1 | 7/2009 | Schlichting et al. |
| 2009/0226746 A1 | 9/2009 | Chakrabarti et al. |
| 2009/0283534 A1 | 11/2009 | Bowers et al. |
| 2009/0286022 A1 | 11/2009 | Bowers et al. |
| 2010/0014964 A1* | 1/2010 | Smith ............... C23C 30/00 415/200 |
| 2010/0018981 A1 | 1/2010 | Hyde et al. |
| 2010/0084037 A1 | 4/2010 | Ericsson et al. |
| 2010/0213200 A1 | 8/2010 | Deane et al. |
| 2010/0226783 A1 | 9/2010 | Lipkin et al. |
| 2010/0232974 A1 | 9/2010 | De Moura et al. |
| 2010/0266391 A1 | 10/2010 | Schlichting et al. |
| 2010/0304063 A1 | 12/2010 | McCrea et al. |
| 2010/0304065 A1 | 12/2010 | Tomantschger et al. |
| 2010/0304171 A1 | 12/2010 | Tomantschger et al. |
| 2010/0325855 A1 | 12/2010 | Sadaka et al. |
| 2011/0033308 A1 | 2/2011 | Huth et al. |
| 2011/0127273 A1 | 6/2011 | Deane et al. |
| 2011/0142597 A1 | 6/2011 | Tsukagoshi et al. |
| 2011/0155745 A1 | 6/2011 | Chou et al. |
| 2011/0236703 A1 | 9/2011 | McGee |
| 2011/0286854 A1* | 11/2011 | Watson ............... F01D 5/288 416/241 R |
| 2011/0287223 A1 | 11/2011 | Victor et al. |
| 2011/0308201 A1 | 12/2011 | Hyde et al. |
| 2012/0000918 A1 | 1/2012 | Deane et al. |
| 2012/0061243 A1 | 3/2012 | Smith et al. |
| 2012/0082541 A1 | 4/2012 | MacChia et al. |
| 2012/0082553 A1* | 4/2012 | Eleftheriou ............ F01D 5/147 416/224 |
| 2012/0082559 A1 | 4/2012 | Guglielmin et al. |
| 2012/0085070 A1 | 4/2012 | Chou et al. |
| 2012/0152893 A1 | 6/2012 | Parkos et al. |
| 2012/0174508 A1 | 7/2012 | Brooks et al. |
| 2012/0275968 A1 | 11/2012 | Puntambekar |
| 2012/0321906 A1 | 12/2012 | McCrea et al. |
| 2013/0034725 A1 | 2/2013 | Paul |
| 2013/0089431 A1* | 4/2013 | Stevenson ............ F01D 5/28 416/241 B |
| 2013/0143058 A1 | 6/2013 | McCrea et al. |
| 2014/0053970 A1 | 2/2014 | Hyde et al. |
| 2014/0057073 A1 | 2/2014 | Hyde et al. |
| 2015/0298791 A1* | 10/2015 | Nordin ............... B64C 3/28 244/45 R |
| 2016/0369635 A1 | 12/2016 | Xu et al. |

FOREIGN PATENT DOCUMENTS

| | | |
|---|---|---|
| EP | 2281746 A2 | 2/2011 |
| EP | 2469025 A2 | 6/2012 |
| JP | 05157190 A | 6/1993 |
| JP | 06170514 A | 6/1994 |
| JP | 06315919 A | 11/1994 |
| JP | 2008062511 A | 3/2008 |
| JP | 2010001511 A | 1/2010 |
| KR | 1020070104792 A | 10/2007 |
| WO | 0146324 A2 | 6/2001 |
| WO | 2012058470 A1 | 5/2012 |

OTHER PUBLICATIONS

English Abstract for Japanese Application No. JP2010001511; Filing date: Jan. 7, 2010.
English Abstract for Japanese Publication No. 06-315919; Date of Publication: Nov. 15, 1994.
International Search Report for International application No. PCT/US2014/045907; International filing date: Jul. 9, 2014; dated Oct. 24, 2014.
International Search Report for International Application No. PCT/US2014/045911; International filing date: Jul. 9, 2014; dated Oct. 30, 2014.
International Search Report for International Application No. PCT/US2014/045913; International filing date: Jul. 9, 2014; dated Oct. 20, 2014.
International Search Report for International application No. PCT/US2014/045921; International filing date: Jul. 9, 2014; dated Oct. 30, 2014.
International Search Report for International Application No. PCT/US2014/045932; International Filing Date: Jul. 9, 2014; dated Oct. 27, 2014.
International Search Report for International Application No. PCT/US2014/046012; International filing date: Jul. 9, 2014; dated Oct. 28, 2014.
International Search Report for International application No. PCT/US2014/046013; International filing date: Jul. 9, 2014; dated Oct. 27, 2014.
International Search Report for International application No. PCT/US2014/046017; International filing date: Jul. 9, 2014; dated Oct. 29, 2014.
International Search Report for International application No. PCT/US2014/045879; International filing date: Jul. 9, 2014; dated Oct. 17, 2014.
PCT Written Opinion for International Application No. PCT/US2014/045913; International filing date: Jul. 9, 2014; dated Oct. 20, 2014.
PCT Written Opinion for International Application No. PCT/US2014/045932; International Filing Date: Jul. 9, 2014; dated Oct. 27, 2014.
PCT International Search Report for International application No. PCT/US2014/045929; International filing date: Jul. 9, 2014; dated Apr. 17, 2015.
PCT Written Opinion for International application No. PCT/US2014/045929; International filing date: Jul. 9, 2014; dated Apr. 17, 2015.
PCT Written Opinion for International Application No. PCT/US2014/045907; International filing date: Jul. 9, 2014; dated Oct. 24, 2014.
PCT Written Opinion for International application No. PCT/US2014/046013; International filing date: Jul. 9, 2014; dated Oct. 27, 2014.
PCT Written Opinion for International Application No. PCT/US2014/046012; International filing date: Jul. 9, 2014; dated Oct. 28, 2014.
PCT Written Opinion for International application No. PCT/US2014/046017; International filing date: Jul. 9, 2014; dated Oct. 29, 2014.

(56) References Cited

OTHER PUBLICATIONS

PCT Written Opinion for International application No. PCT/US2014/045911; International filing date: Jul. 9, 2014; dated Oct. 30, 2014.
PCT Written Opinion for International application No. PCT/US2014/045879; International filing date: Jul. 9, 2014; dated Oct. 17, 2014.
PCT Written Opinion for International application No. PCT/US2014/045921; International filing date: Jul. 9, 2014; dated Oct. 30, 2014.
European Search Report for European Application No. 14851565.3, dated Mar. 24, 2017, 10 pages.

* cited by examiner

HIGH-MODULUS COATING FOR LOCAL STIFFENING OF AIRFOIL TRAILING EDGES

CROSS-REFERENCE TO RELATED APPLICATIONS

This application claims priority under 35 U.S.C. § 119(e) to U.S. Provisional Patent Application Ser. No. 61/844,108 filed on Jul. 9, 2013.

FIELD OF THE DISCLOSURE

The present disclosure generally relates to airfoils. More specifically, this disclosure relates to airfoils having trailing edges formed from high-modulus platings.

BACKGROUND

Turbine engine airfoils are teardrop-shaped structures (in cross-section) with a rounded leading edge and a wedge-shaped trailing edge tapering down to a minimum thickness. From an aerodynamic perspective, tapering down the trailing edge to a zero thickness would be ideal as such an arrangement would potentially eliminate the bluff body close-out shape of the trailing edge and its attendant drag-induced flow separation. However, from a practical standpoint, both manufacturing constraints and stiffness requirements limit how thin a trailing edge can be made. In particular, adequate stiffness of the trailing edge is required to enable the airfoil to resist flutter excitation, early fatigue-induced cracking, and structural failure of the airfoil. Moreover, current lightweight airfoil materials such as aluminum, organic mesomorphous carbon composites, and titanium have low elastic modulus, which necessitates thicker-than-desirable trailing edges.

Clearly, there is a need for airfoil design strategies and manufacturing techniques which allow for thinner trailing edges while improving the stiffness and resistance to fatigue-induced cracking at the trailing edge.

SUMMARY OF THE DISCLOSURE

In accordance with one aspect of the present disclosure, an airfoil is disclosed. The airfoil may comprise a leading edge, a body portion, and a trailing edge formed from a high-modulus plating. The body portion may be formed from a material having a lower elastic modulus than the high-modulus plating.

In another refinement, the material forming the body portion may be selected from the group consisting of aluminum, titanium, and a composite material.

In another refinement, the high-modulus plating may be formed from one or more layers of a metal or metal alloy selected from the group consisting of nickel, iron, cobalt, and an alloy of any of the foregoing elements comprising at least 50 wt. % of the alloy.

In another refinement, the body portion may be truncated at a back side prior to the trailing edge, and the high-modulus plating may be applied to a back surface of the back side to form the trailing edge.

In another refinement, the high-modulus plating may be applied to the back surface of the body portion by a method selected from the group consisting of electrolytic plating, electroless plating, brush plating, spray metal deposition, chemical vapor deposition, plasma vapor deposition, and a powder spray deposition process.

In another refinement, the high-modulus plating may have a thickness of about 1.3 mm near the back surface of the body portion and a thickness of about 0.025 mm near a tip of the trailing edge.

In another refinement, at least one surface of the body portion may be plated with the high-modulus plating.

In another refinement, the airfoil may further comprise an insulating layer between the body portion and the high-modulus plating.

In another refinement, the insulating layer may be formed from a material selected from the group consisting of an adhesive, an epoxy material, and a ceramic.

In accordance with another aspect of the present disclosure, an airfoil is disclosed. The airfoil may comprise a body portion forming a leading edge and an intact trailing edge. The airfoil may further comprise a high-modulus plating applied to and forming an extension of the intact trailing edge.

In another refinement, the body portion may be formed from a material selected from the group consisting of aluminum, titanium, and a composite material.

In another refinement, the high-modulus plating may be formed from one or more layers of a metal or metal alloy selected from the group consisting of nickel, iron, cobalt, and an alloy of any of the foregoing elements comprising at least 50 wt. % of the alloy.

In another refinement, the high-modulus plating may be applied to the intact trailing edge by a method selected from the group consisting of electrolytic plating, electroless plating, brush plating, spray metal deposition, chemical vapor deposition, plasma vapor deposition, and a powder spray deposition process.

In another refinement, at least one surface of the body portion may be plated with the high-modulus plating.

In another refinement, the airfoil may further comprise an insulating layer between the body portion and the high-modulus plating.

In accordance with another aspect of the present disclosure, a method for fabricating an airfoil is disclosed. The method may comprise: 1) forming a body portion of the airfoil with a low-modulus material, and 2) applying a high-modulus plating to the body portion to form a trailing edge. The body portion of the airfoil may be formed from a material having a lower elastic modulus than the high-modulus plating.

In another refinement, the material forming the body portion may be selected from the group consisting of aluminum, titanium, and a composite material. The high-modulus plating may be formed from one or more layers of a metal or metal alloy selected from the group consisting of nickel, iron, cobalt, and an alloy of any of the foregoing elements comprising at least 50 wt. % of the alloy.

In another refinement, forming the body portion of the airfoil may comprise forming an airfoil that is truncated at a back side prior to the trailing edge, and applying the high-modulus plating to the body portion to form the trailing edge may comprise applying the high-modulus plating to a back surface of the back side.

In another refinement, forming the body portion of the airfoil may comprise forming an airfoil with an intact trailing edge, and applying the high-modulus plating to the body portion to form the trailing edge may comprise applying the high-modulus plating to the intact trailing edge to form an extension of the intact trailing edge.

In another refinement, the method may further comprise shaping the high-modulus plating by machining or abrasive grinding.

It should be understood that the drawings are not necessarily drawn to scale and that the disclosed embodiments are sometimes illustrated schematically and in partial views. It is to be further appreciated that the following detailed description is merely exemplary in nature and is not intended to limit the invention or the application and uses thereof. In this regard, it is to be additionally appreciated that the described embodiment is not limited to use with gas turbine engine airfoils. Hence, although the present disclosure is, for convenience of explanation, depicted and described as certain illustrative embodiments, it will be appreciated that it can be implemented in various other types of embodiments and in various other systems and environments.

DETAILED DESCRIPTION

Figure 1:
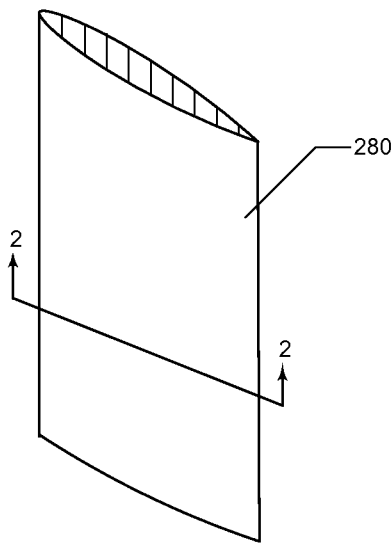
FIG. 1 is a perspective view of an airfoil of a gas turbine engine constructed in accordance with the present disclosure.
Figure 2:
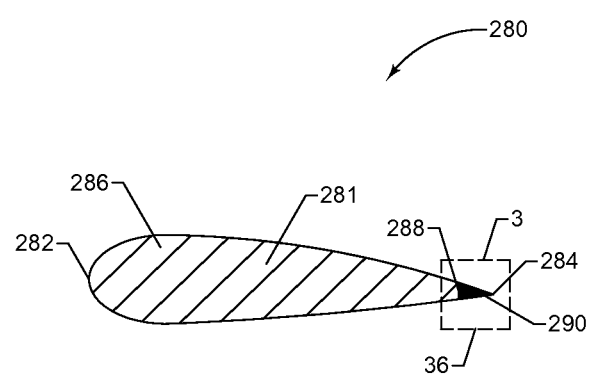
FIG. 2 is a cross-sectional view of the airfoil of FIG. 1 taken along the line 2-2 of FIG. 1, constructed in accordance with the present disclosure.

Referring now to FIGS. 1 and 2, an airfoil 280 is shown. The airfoil 280 may be a rotating blade or a stator vane of a gas turbine engine. Alternatively, the airfoil 280 may be an airfoil for use in other applications such as, but not limited to, wind turbines, unmanned aerial vehicles (UAVs), micro-UAVs, race car down-force wings, missile wings, ballistic weapons, and guided weapons. The airfoil 280 may have a body portion 281, a leading edge 282, a trailing edge 284, a forward region 286, and a back side 288, as shown in FIG. 2. The leading edge 282 may be the portion of the airfoil 280 which first contacts (and separates) air, whereas the trailing edge 284 may be the portion of the airfoil where the separated air rejoins. By virtue of a high-modulus plating 290 at the trailing edge 284, the trailing edge 284 may have a minimum practical thickness which may advantageously eliminate or reduce undesirable bluff body close out shape at the trailing edge 284 as well as consequent drag-inducing flow separation and turbulent airflow (see further details below). Accordingly, the aerodynamic operation of the airfoil 280 may be substantially improved over current systems that lack such high-modulus platings at the airfoil trailing edge.

Figure 3:
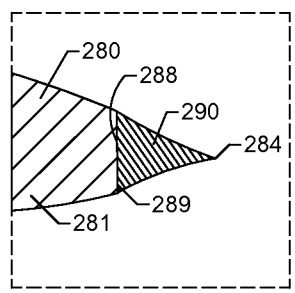
FIG. 3 is an exploded view of detail 3 of FIG. 2, illustrating a plating on a back side of the airfoil to produce a thin trailing edge, constructed in accordance with the present disclosure.

The body portion 281 of the airfoil 280 (i.e., the portion of the airfoil 280 which does not include the plating 290) may be formed from one or more lightweight and relatively low-modulus materials such as, but not limited to, aluminum, titanium, or an organic mesomorphous carbon (OMC) composite. As best shown in FIG. 3, the airfoil 280 may be truncated just prior to the start of the trailing edge 284 (i.e., at the back side 288) and the trailing edge 284 may be formed from the plating 290. The plating 290 may be formed from one or more layers of one or more high-modulus materials such as, but not limited to, nickel, iron, cobalt, and alloys of the foregoing elements comprising at least 50 wt. % of the alloy. The high-modulus nature of the material forming the plating 290 may enable a thinner trailing edge while maintaining necessary stiffness and resistance to flutter excitation and fatigue-induced cracking than could feasibly be produced with the lower-modulus materials forming the body portion 281 of the airfoil 280.

The plating 290 may be applied to a back surface 289 of the airfoil 280 by a metal deposition method apparent to those of ordinary skill in the art such as, but not limited to, electrolytic plating, electroless plating, brush plating, spray metal deposition, chemical vapor deposition, plasma vapor deposition, or a powder spray deposition process. The thickness of the plating 290 may range from about 0.001 inches (about 0.025 mm) near the tip of the trailing edge 284 to about 0.050 inches (about 1.3 mm) near the back side 288 of the airfoil 280, but other plating thicknesses may also apply. As one possible plating deposition method, the plating 290 may be initially deposited as a thick layer by one of the above-listed techniques and may be subsequently thinned and shaped in selected regions by a machining process or an abrasive grinding operation apparent to those of ordinary skill in the art. Such shaping techniques may enable the trailing edge 284 to be thinned and shaped to a minimum practical thickness.

Figure 4:
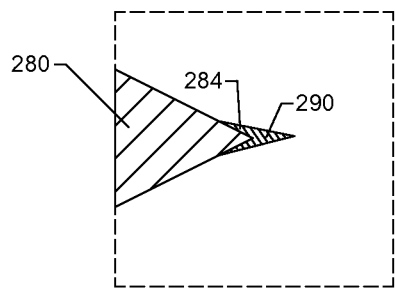
FIG. 4 is an exploded view similar to FIG. 3, but with the plating applied to the surface of an intact airfoil trailing edge, constructed in accordance with the present disclosure.
Figure 5:
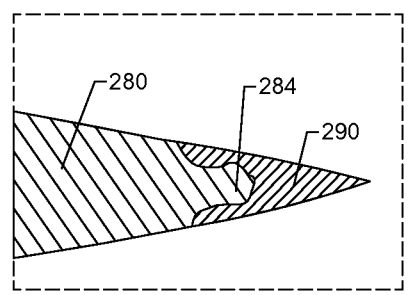
FIG. 5 is an exploded view similar to FIG. 4, but with the plating applied to the surface of a modified intact airfoil trailing edge, constructed in accordance with the present disclosure.

As an alternative arrangement, the plating 290 may be deposited on an intact (non-truncated) trailing edge 284 of the airfoil 280 or it may be deposited on a modified intact trailing edge 284, as shown in FIGS. 4 and 5, respectively. In this way, the plating 290 may form an extension of the trailing edge 284 and may be thinned to a minimum practical thickness while maintaining necessary stiffness and fracture resistance.

Figure 6:
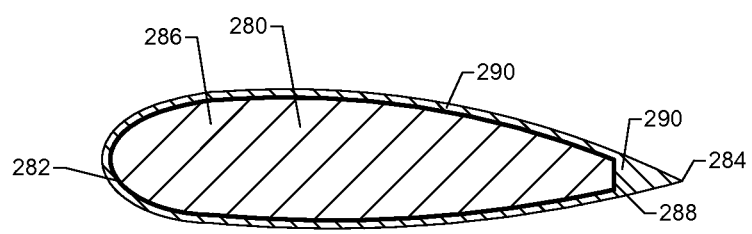
FIG. 6 is a cross-sectional view of the airfoil and similar to FIG. 2, but having the metal coating applied to all external surfaces of the airfoil, constructed in accordance with the present disclosure.

The plating 290 may be applied to additional selected external surfaces of the airfoil 280 or to all external surfaces of the airfoil 280 such that the airfoil may be fully encased in the plating 290, as best shown in FIG. 6. Such an arrangement may be desired to eliminate an exposed bondline edge between the material of the plating 290 and the material of the airfoil 280 which could otherwise present a potential delamination and peeling initiation point. If the airfoil 280 is encased in the plating 290, the plating 290 may be thinner near the forward regions 286 of the airfoil 280 and thicker near the back side 288, although other plating thickness variations may also be used.

Figure 7:
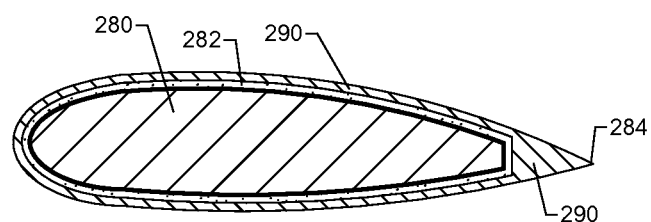
FIG. 7 is a cross-sectional view of the airfoil and similar to FIG. 6, but having an insulating layer between plating and the external surface of the airfoil, constructed in accordance with the present disclosure.

In situations where the formation of strength-limiting or ductility-limiting phases (e.g., intermetallics) is expected at the interface between the surfaces of the airfoil 280 and the plating 290, or, in cases where galvanic corrosion at the interface of the airfoil 280 and the plating 290 is a concern, one or more insulating layers 292 may optionally be applied between the surfaces of the airfoil 280 and the plating 290 to produce a multi-layer structure, as shown in FIG. 7. The insulating layer 292 may prevent contact between the plating 290 and the surfaces of the airfoil 280 and thereby assist in preventing the formation of strength- or ductility-limiting phases and/or galvanic corrosion. The insulating layer 292 may be an adhesive, an epoxy material, a ceramic, or any other suitable material selected for such purposes by a skilled artisan. If necessary, the multi-layer structure shown in FIG. 7 may be brazed, transient liquid phase bonded, or diffusion bonded to form a more permanent joint between the airfoil 280 and the plating 290, as will be understood by those having ordinary skill in the art.

Figure 8:
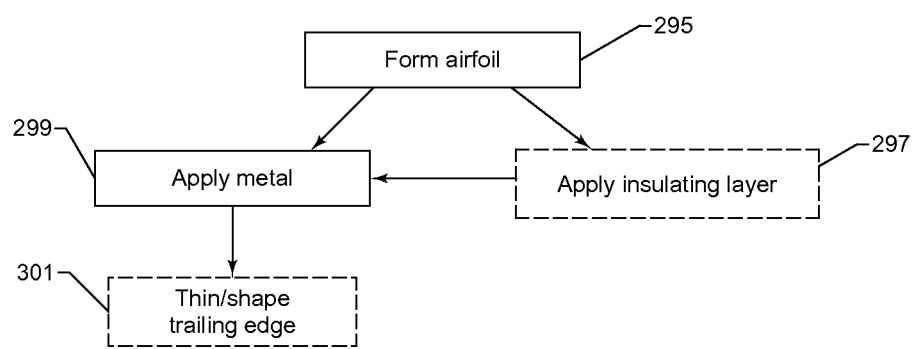
FIG. 8 is a flow chart illustrating steps involved in the fabrication of the airfoil, in accordance with a method of the present disclosure.

A method which may be employed for the fabrication of the airfoil 280 is shown in FIG. 8. Beginning with a first block 295, the airfoil 280 may be formed with a truncated trailing edge (see FIG. 3), an intact trailing edge (see FIG. 4), or a modified intact trailing edge (see FIG. 5) using a low-modulus material such as, but not limited to, aluminum, titanium, or composite material. Optionally, an insulating layer 292 may be applied to the surfaces of the airfoil 280 which are to be plated with the plating 290 according to an optional block 297. Whether or not an insulating layer 292 is applied, the plating 290, consisting of a high-modulus material, may be applied to selected surfaces of the airfoil 280 according to a block 299, as shown. The plating 290 may be applied by known metal deposition processes including, but not limited to, electrolytic plating, electroless plating, brush plating, spray metal deposition, chemical vapor deposition, plasma vapor deposition, or a powder spray deposition process. In this way, a trailing edge 284 may be built up on the back surface 289 of the airfoil 280 (see FIG. 3), or, the plating 290 may be deposited as an extension of an existing airfoil trailing edge (see FIGS. 4-5). Furthermore, the plating 290 may be deposited on additional or all external surfaces of the airfoil (see FIG. 6). The plating 290 may either be directly deposited such that a thin trailing edge is formed or it may be thinned and/or shaped at the trailing edge 284 or other selected regions as desired by a machining or abrasive grinding operation according to an optional block 301.

INDUSTRIAL APPLICABILITY

The present disclosure introduces a strategy for applying a thin plating of a high-modulus material to the trailing edge of an airfoil that is formed from a relatively low-modulus material to significantly improve the stiffness of the trailing edge, while allowing thinner practical trailing edges to be formed. Such stiffening of airfoil trailing edges, which are exposed to high-velocity airflow, pressure, and velocity pulses during operation, may improve the trailing edge fatigue life for a given thickness or may provide at least an equivalent fatigue life at reduced trailing edge thicknesses compared with current low-modulus airfoil materials. This technology may find wide industrial applicability in a wide range of areas including, but not limited to, gas turbine engines, unmanned aerial vehicles (UAVs), micro-UAVs, wind turbines, race car down-force wings, missile wings, ballistic weapons, and guided weapons.

What is claimed is:

1. An airfoil, comprising:
   a leading edge;
   a body portion; and
   a trailing edge formed from a high-modulus plating, the body portion being formed from a material that has a lower elastic modulus than the high-modulus plating, wherein the body portion is truncated at a backside prior to the trailing edge, and wherein the high-modulus plating is applied to a back surface of the back side to form the trailing edge.

2. The airfoil of claim 1, wherein the material forming the body portion is selected from the group consisting of aluminum, titanium, and a composite material.

3. The airfoil of claim 2, wherein the high-modulus plating is formed from one or more layers of a metal or a metal allow selected from the group consisting of nickel, iron, cobalt, and an alloy of any of the foregoing elements comprising at least 50 wt. % of the alloy.

4. The airfoil of claim 1, wherein the high-modulus plating is applied to the back surface of the body portion by a method selected from the group consisting of electrolytic plating, electroless plating, brush plating, spray metal deposition, chemical vapor deposition, plasma vapor deposition, and a powder spray deposition process.

5. The airfoil of claim 1, wherein the high-modulus plating has a thickness of about 1.3 mm near the back surface of the body portion, and a thickness of about 0.025 mm near a tip of the trailing edge.

6. The airfoil of claim 1, wherein at least one surface of the body portion is plated with the high-modulus plating.

7. The airfoil of claim 6, further comprising an insulating layer between the body portion and the high-modulus plating.

8. The airfoil of claim 7, wherein the insulating layer is formed from a material selected from the group consisting of an adhesive, an epoxy material, and a ceramic.

9. An airfoil, comprising:
   a body portion forming a leading edge and an intact trailing edge; and
   a high-modulus plating applied to and forming an extension of the intact trailing edge, wherein the body portion is formed from a material selected from the group consisting of titanium and a composite material and wherein the high-modulus plating is applied to the intact trailing edge by a method selected from the group consisting of electrolytic plating, electroless plating, brush plating, spray metal deposition, chemical vapor deposition, plasma vapor deposition, and a powder spray deposition process.

10. The airfoil of claim 9, wherein the high-modulus plating is formed from one or more layers of a metal or metal alloy selected from the group consisting of nickel, iron, cobalt, and an alloy of any of the foregoing elements comprising at least 50 wt. % of the alloy.

11. The airfoil of claim 9, wherein at least one surface of the body portion is plated with the high-modulus plating.

12. The airfoil of claim 11, further comprising an insulating layer between the body portion and the high-modulus plating.

13. A method for fabricating an airfoil, comprising:
   forming a body portion of the airfoil; and
   applying a high-modulus plating to the body portion to form a trailing edge, the body portion of the airfoil being formed from a material having a lower elastic modulus than the high-modulus plating, wherein the material forming the body portion is selected from the group consisting of titanium and a composite material, and wherein the high-modulus plating is formed from one or more layers of a metal or a metal alloy selected from the group consisting of nickel, iron, cobalt, and an alloy of any of the foregoing elements comprising at least 50 wt. % of the alloy.

14. The method of claim 13, wherein forming the body portion of the airfoil comprises forming an airfoil that is truncated at a back side prior to the trailing edge, and wherein applying the high-modulus plating to the body portion to form the trailing edge comprises applying the high-modulus plating to a back surface of the back side.

15. The method of claim 13, wherein forming the body portion of the airfoil comprises forming an airfoil with an intact trailing edge, wherein applying the high-modulus plating to the body portion to form the trailing edge comprises applying the high-modulus plating to the intact trailing edge to form an extension of the intact trailing edge.

16. The method of claim 13, further comprising shaping the high-modulus plating by machining or abrasive grinding.

* * * * *